US011270748B2

(12) United States Patent
Luo et al.

(10) Patent No.: US 11,270,748 B2
(45) Date of Patent: Mar. 8, 2022

(54) MEMORY STRUCTURE FOR ARTIFICIAL INTELLIGENCE (AI) APPLICATIONS

(71) Applicant: Aspiring Sky Co., Limited, Hong Kong (CN)

(72) Inventors: Zhijiong Luo, Hopewell Township, PA (US); Xuntong Zhao, Shanghai (CN)

(73) Assignee: Aspiring Sky Co., Limited, Hong Kong (CN)

( * ) Notice: Subject to any disclaimer, the term of this patent is extended or adjusted under 35 U.S.C. 154(b) by 37 days.

(21) Appl. No.: 16/782,157

(22) Filed: Feb. 5, 2020

(65) Prior Publication Data

US 2020/0251157 A1 Aug. 6, 2020

Related U.S. Application Data

(60) Provisional application No. 62/801,299, filed on Feb. 5, 2019.

(51) Int. Cl.
| | | |
|---|---|---|
| *G11C 11/22* | (2006.01) | |
| *G11C 11/16* | (2006.01) | |
| *G11C 14/00* | (2006.01) | |
| *G11C 13/00* | (2006.01) | |
| *G06N 20/00* | (2019.01) | |

(52) U.S. Cl.
CPC ......... *G11C 11/2273* (2013.01); *G06N 20/00* (2019.01); *G11C 11/1655* (2013.01); *G11C 11/1673* (2013.01); *G11C 11/2255* (2013.01); *G11C 13/004* (2013.01); *G11C 13/0026* (2013.01); *G11C 14/009* (2013.01); *G11C 14/0072* (2013.01); *G11C 14/0081* (2013.01); *G11C 2213/79* (2013.01)

(58) Field of Classification Search
CPC ............ G11C 11/2273; G11C 11/1655; G11C 11/1673; G11C 11/2255; G11C 13/0026; G11C 13/004; G11C 14/0072; G11C 14/0081; G11C 14/009; G11C 2213/79; G06N 20/00
See application file for complete search history.

(56) References Cited

U.S. PATENT DOCUMENTS

| | | | | |
|---|---|---|---|---|
| 2016/0125919 A1* | 5/2016 | Hush | ...................... | G11C 7/065 |
| | | | | 365/205 |
| 2018/0144240 A1* | 5/2018 | Garbin | .................... | G06N 3/063 |
| 2020/0311523 A1* | 10/2020 | Hoang | ..................... | G11C 11/54 |

* cited by examiner

*Primary Examiner* — Tuan T Nguyen
(74) *Attorney, Agent, or Firm* — Hertzberg, Turk & Associates, LLC (57) ABSTRACT

Technologies for various memory structures for artificial intelligence (AI) applications and methods thereof are described. An XNOR circuit along with a sense amplifier may be combined with an array (or multiple arrays) of memory such as non-volatile memory (NVM) or an NVM, SRAM combination to perform an XNOR operation on the data read from the memory. Various versions may include different connections allowing simplification of circuitry or timing. In some examples, memory array may include programmable resistor/switch device combinations, or multiple columns connected to a single XNOR+SA circuit.

18 Claims, 12 Drawing Sheets

MEMORY STRUCTURE FOR ARTIFICIAL INTELLIGENCE (AI) APPLICATIONS

CROSS REFERENCE TO RELATED APPLICATIONS

This application claims the benefit of U.S. Provisional Patent Application Ser. No. 62/801,299 filed on Feb. 5, 2019. The disclosures of the provisional application are hereby incorporated by reference for all purposes.

BACKGROUND

Unless otherwise indicated herein, the materials described in this section are not prior art to the claims in this application and are not admitted to be prior art by inclusion in this section.

XNOR is a digital logic function that is the logical complement of the exclusive OR (XOR) function. A two-input version of XNOR implements logical equality, sometimes called an "equivalence gate", where a high output (1) results if both of the inputs to the gate are the same. If one but not both inputs are high (1), a low output (0) results. Many Artificial Intelligence (AI) applications involve retrieval of data from memory and executing XNOR operations. Traditional memories, such as non-volatile memory (NVM) only store data, and need additional separate digital circuits to do the XNOR operation. Thus, circuitry for logic operations and memory need to be separate and can consume valuable integrated circuit area.

SUMMARY

Briefly stated, technologies are generally described herein for various memory structures for artificial intelligence (AI) applications and methods thereof.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

all arranged according to at least some embodiments presented herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description and drawings are not meant to be limiting. Other embodiments may be utilized, and other changes may be made, without departing from the spirit or scope of the subject matter presented herein. The aspects of the present disclosure, as generally described herein, and illustrated in the figures, can be arranged, substituted, combined, separated, and designed in a wide variety of different configurations, all of which are explicitly contemplated herein.

This disclosure is generally drawn, inter alia, to technologies for various memory structures for artificial intelligence (AI) applications and methods thereof. An XNOR circuit along with a sense amplifier may be combined with an array (or multiple arrays) of memory such as non-volatile memory (NVM) or an NVM, SRAM combination to perform an XNOR operation on the data read from the memory. Various versions may include different connections allowing simplification of circuitry or timing. In some examples, memory array may include programmable resistor/switch device combinations, or multiple columns connected to a single XNOR+SA circuit.

As used herein, NVM memory may include, but is not limited to, a floating gate memory, an eFlash memory, a pFlash memory, a SONOS memory, a RRAM (resistive RAM), phase change memories, or magnetic base memories, such as MRAM, and STTRAM.

Figure 1:
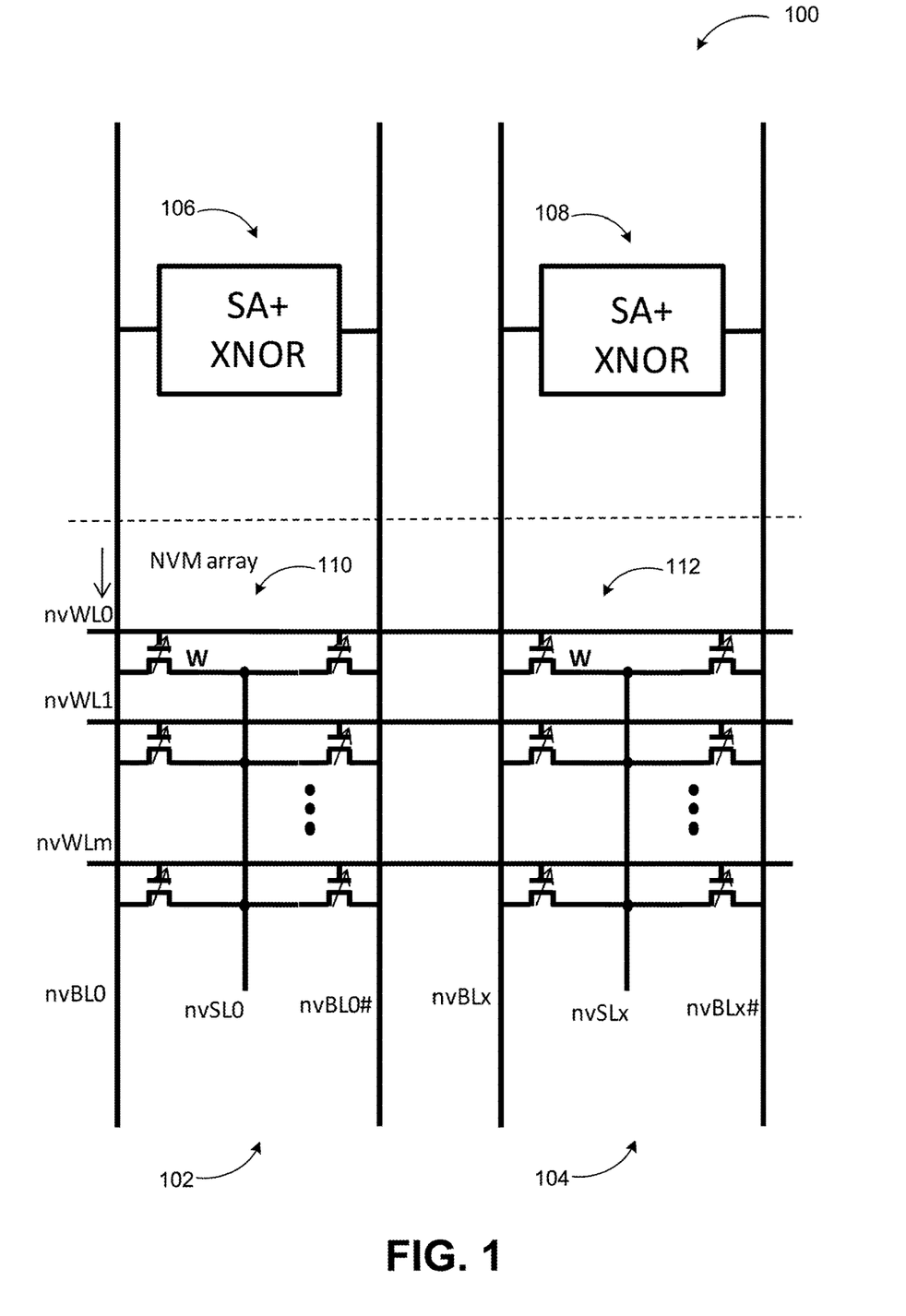
FIG. 1 is a schematic circuit diagram illustrating an example NVM memory structure with an XNOR cell for AI applications.

FIG. 1 is a schematic circuit diagram illustrating an example NVM memory structure with an XNOR cell for AI applications, arranged in accordance with embodiments described herein.

Diagram 100 shows two example columns 102 and 104 of a memory structure according to embodiments. Each column includes an NVM array (110 and 112) and corresponding sense amplifier (SA) and XNOR circuits (106 and 108).

Traditional NVM circuits can only store data in the memory array. The memory according to embodiments can execute the XNOR operation during the READ operation with only a little area consumption. A source-line nvSL can be a common line for the NVM cell in the array or a separated line for each column. A differential pair of NVM cells may be implemented for each SA+XNOR cell. In some embodiments, the NVM cells may use the SONOS split gate cell. The control gate signal is simplified in this description. A HVt cell on nvBL and a LVt cell on nvBL # means a data '0' (Q=0/QB=1), while a LVt cell on nvBL and a HVt cell on nvBL # means a data '1' (Q=1/QB=0).

Various types of transistors may be used in embodiments. The disclosure may use, for purposes of illustration, metal-oxide semiconductor field effect transistors (MOSFET). A MOSFET may have a source terminal (e.g., a first terminal), a drain terminal (e.g., a second terminal), and a control terminal. When an appropriate level of bias signal is applied to the control terminal, the transistor may be activated (e.g., biased into active operation) wherein conduction between the source terminal and the drain terminal may be facilitated. Depending on the type of transistor (e.g., N-type or P-type), an appropriate level of bias signal may be applied, or previously applied bias signal may be removed, to cause the transistor to be deactivated wherein conduction between the source and the drain may be abated. A MOSFET "terminal" may also be termed a "port."

The NVM arrays 102, 104 110, 112 having a plurality of NVM memory cells may implemented in a matrix by m rows coupled to a plurality of word lines (e.g., first word line nvWL0, mth word line nvWLm, etc.) and x columns coupled to bit lines (nvBL0 to nvBL0 #). Each NVM cell may include two floating gate field effect transistors (FETs) in a differential configuration. The floating gate memory transistor having a gate region, a source region and a drain region. The transistors may be arranged in parallel in columns with their drain connect to a common drain or bit line, and their source to a common source line.

The gates of the NVM cells may connected to the word-line nvWL0 and a source to drain (S/D) terminal of the cell may connected to a bit-line nvBL0/nvBL0 # and a source-line nvSL0. A first set of bit lines may be connected to a drain region of memory transistor in each of the memory cells in a respective column nvBL0. A second set of bit lines may each provide a source line nvSL0 that is electrically connected to a source region of memory transistor in each of the memory cells along a respective column. The common source line nvSL0 and nvSLx may be separated individually or connected together. The NVM cell is not limited to a SONOS cell, but also can be the floating gate cell, eFlash cell, pFlash cell and so on.

Figure 2:
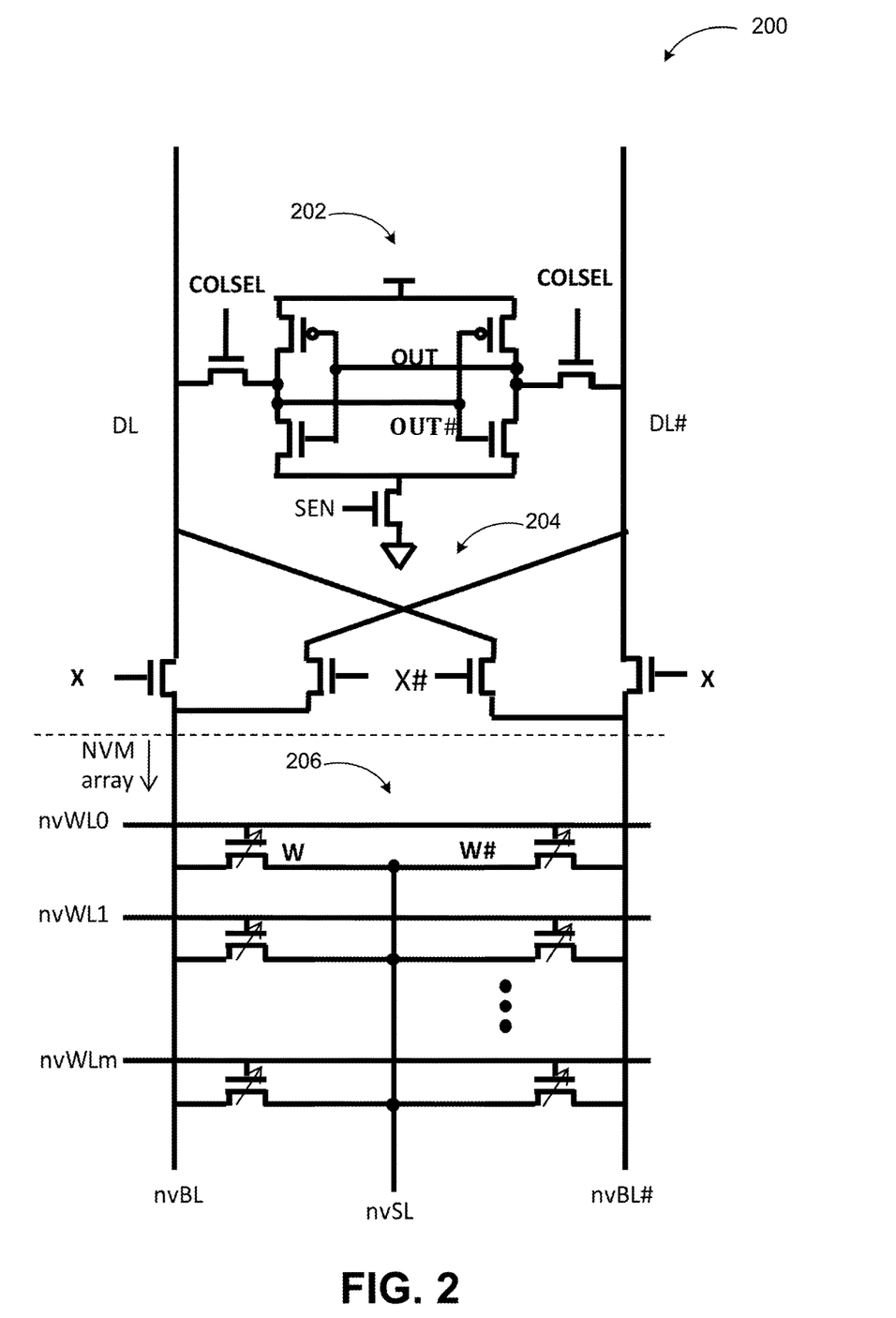
FIG. 2 is a schematic circuit diagram illustrating an example NVM memory column with an XNOR cell and sense amplifier for AI applications.

FIG. 2 is a schematic circuit diagram illustrating an example NVM memory column with an XNOR cell and sense amplifier for AI applications, arranged in accordance with embodiments described herein.

Diagram 200 shows one example column of an NVM array 206 with an SA 202 and XNOR circuit 204.

An example XNOR operation during reading of data from the NVM array 206 may include NVM bit-line nvBL/nvBL # and SA input DL/DL # being initialized at GND level before the read. Then, the NVM cells may be activated by nvWL. A VDD voltage level may be applied to nvSL and the nvBL/nvBL # may be charged up through the NVM cell. Due to the Vt difference between the differential NVM cells, nvBL/nvBL # may have a difference. Through the cross-connected NMOS transistors connecting with X/X #, the difference between nvBL/nvBL # may transfer to DL/DL #. When X=1, the DL/DL # may connect with nvBL/nvBL #. When X=0, the DL/DL # may connect with nbBL #/nvBL. And, the difference between DL and DL # may transfer into internal node OUT and OUT #. Finally, the SA enable signal (SEN) may be ramped up. Due to the difference between DL and DL #, the data may be latched by the SA, and OUT=XNOR(X,W). Table 1 shows examples of the various bit values.

TABLE 1

| OUT = XNOR(X,W) | | | | |
|---|---|---|---|---|
| X | W | nvBL | DL | OUT |
| 0 | 0 | 1 | 0 | 1 |
| 0 | 1 | 0 | 1 | 0 |
| 1 | 0 | 1 | 1 | 0 |
| 1 | 1 | 0 | 0 | 1 |

Figure 3:
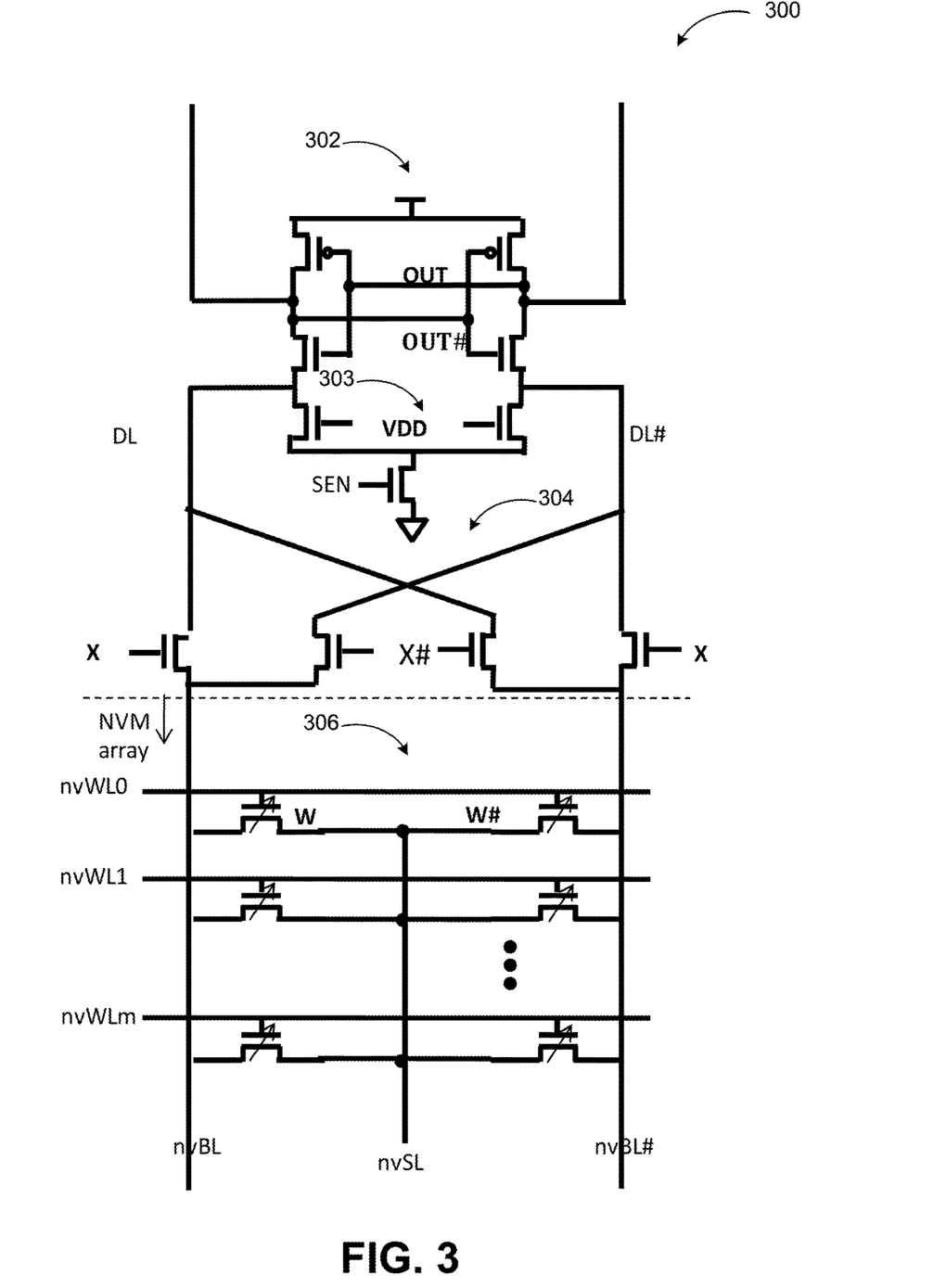
FIG. 3 is a schematic circuit diagram illustrating a different version of the example NVM memory column of FIG. 2 with an XNOR cell and sense amplifier for AI applications.

FIG. 3 is a schematic circuit diagram illustrating a different version of the example NVM memory column of FIG. 2 with an XNOR cell and sense amplifier for AI applications, arranged in accordance with embodiments described herein.

Diagram 300 shows a variation of the memory structure of FIG. 2, where DL/DL # are connected to an SA internal node 303 in the SA 302 with the example column also including NVM array 306 and XNOR circuit 304. In the example column of FIG. 3, the DL/DL # are connected to the SA internal node 303 without a pass gate device controlled by the column select (COLSEL) signal. The example memory structure can be used to reduce a complexity of timing control circuit (i.e., reduce COLSEL signal).

Figure 4:
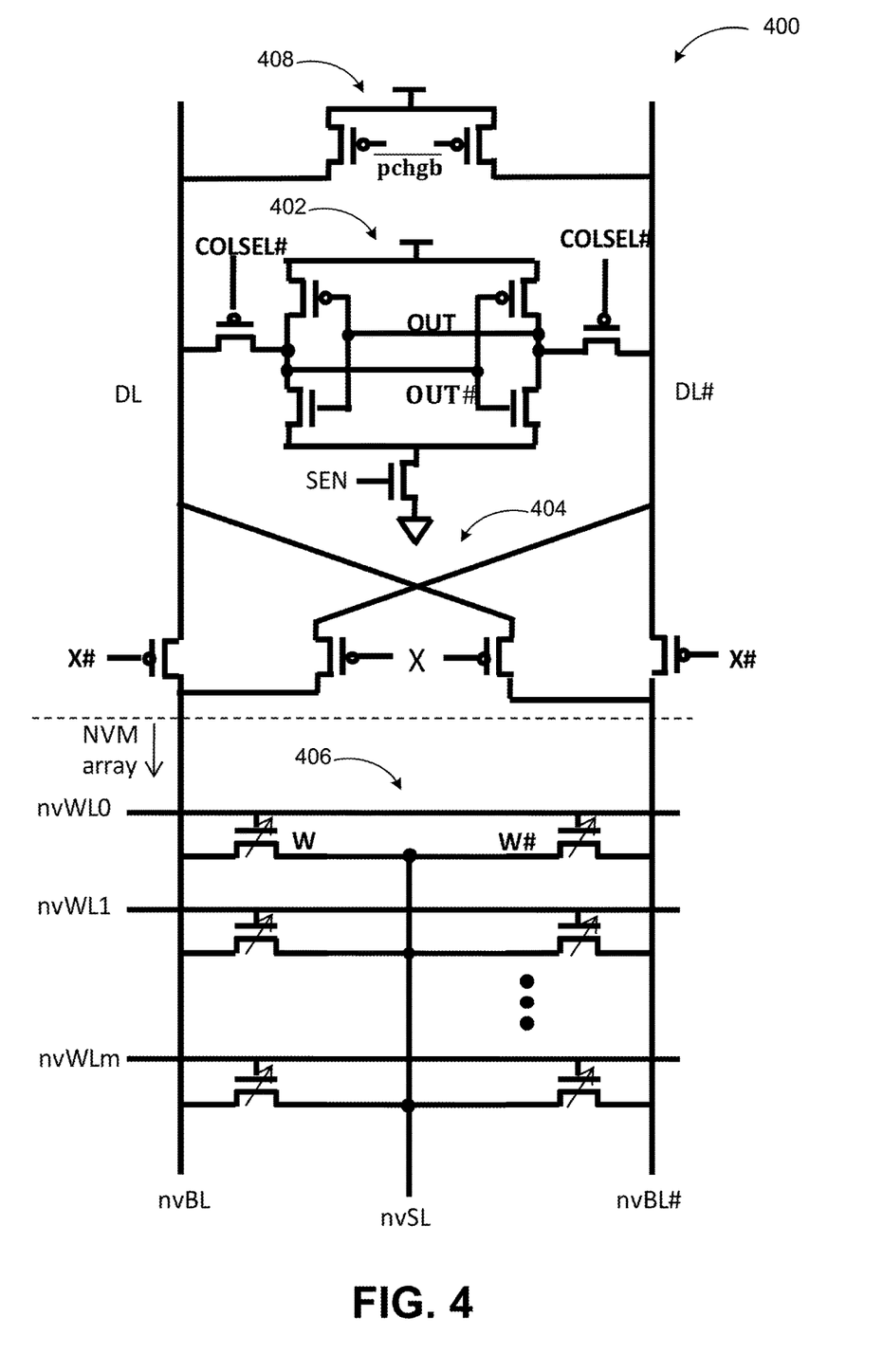
FIG. 4 is a schematic circuit diagram illustrating another example NVM memory column with an XNOR cell and sense amplifier for AI applications.

FIG. 4 is a schematic circuit diagram illustrating another example NVM memory column with an XNOR cell and sense amplifier for AI applications, arranged in accordance with embodiments described herein.

Diagram 400 shows the SA 402, XNOR circuit 404, and NVM array 406 with precharge device (PRE_CHARGE) 408, which is used to charge DL/DL # to VDD level.

An example XNOR operation during reading of data from the NVM array 406 may include NVM bit-line nvBL/nvBL # and SA input DL/DL # being initialized at VDD level before the read by PRE_CHARGE device. Then, the NVM cells may be activated by nvWL. A GND voltage level may be applied to nvSL and the nvBL/nvBL # may be discharged down through the NVM cell. Due to the Vt difference between the differential NVM cells, nvBL/nvBL # may have a difference. Through the cross-connected PMOS transistors connecting with X/X #, the difference between nvBL/nvBL # may transfer to DL/DL #. When X=0, the DL/DL # may connect with nvBL #/nvBL. When X=1, the DL/DL # may connect with nbBL/nvBL #, and the difference between DL and DL # may transfer into internal node OUT and OUT #. Finally, the SA enable signal (SEN) may be ramped up. Due to the difference between DL and DL #, the data may be latched by the SA, and OUT=XNOR(X,W). Table 2 shows examples of the various bit values.

TABLE 2

| | | OUT = XNOR(X,W) | | |
|---|---|---|---|---|
| X | W | nvBL | DL | OUT |
| 0 | 0 | 1 | 0 | 1 |
| 0 | 1 | 0 | 1 | 0 |
| 1 | 0 | 1 | 1 | 0 |
| 1 | 1 | 0 | 0 | 1 |

Figure 5:
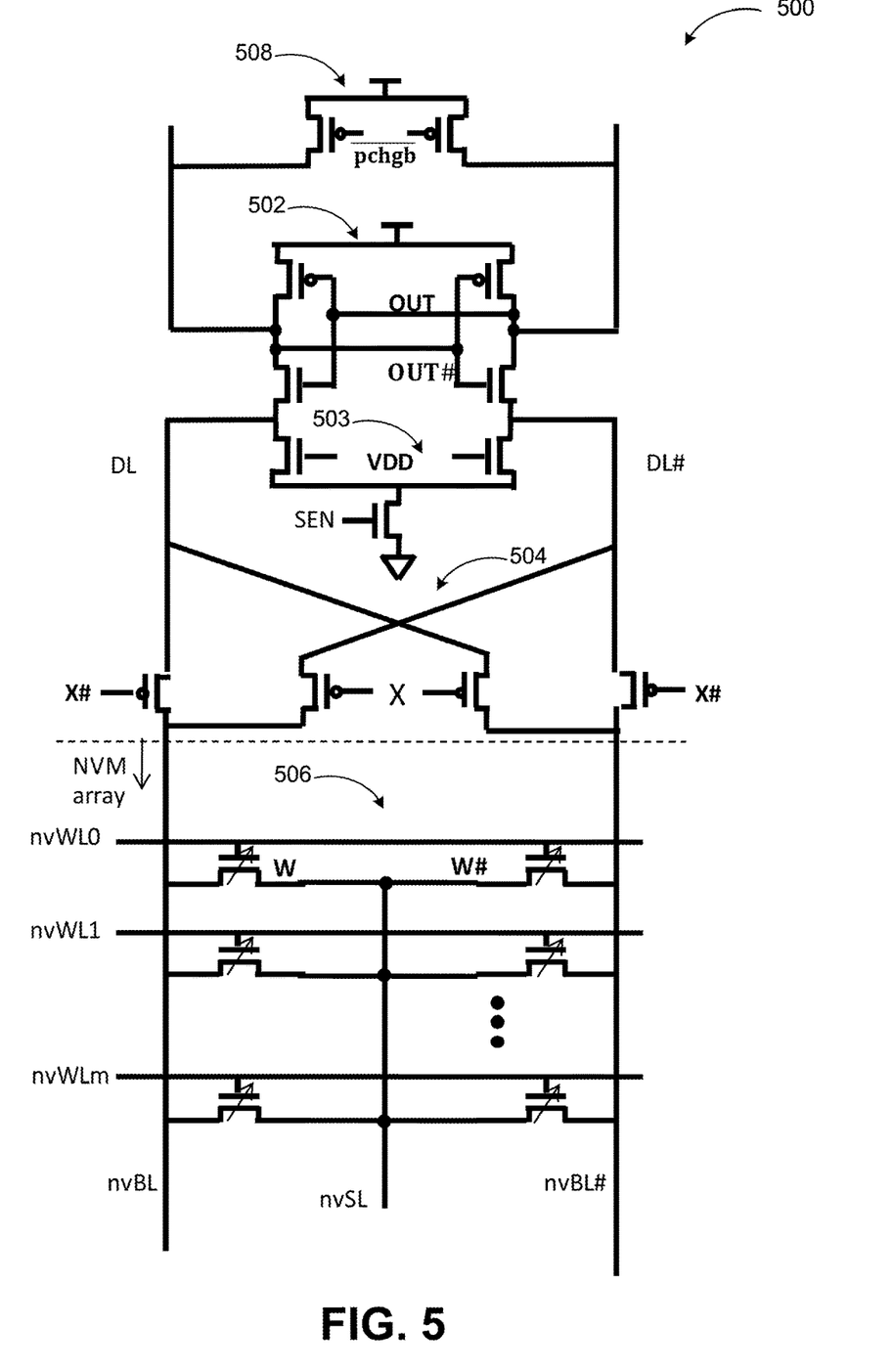
FIG. 5 is a schematic circuit diagram illustrating a different version of the example NVM memory column of FIG. 4 with an XNOR cell and sense amplifier for AI applications.

FIG. 5 is a schematic circuit diagram illustrating a different version of the example NVM memory column of FIG. 4 with an XNOR cell and sense amplifier for AI applications, arranged in accordance with embodiments described herein.

Diagram 500 shows a variation of the memory structure of FIG. 4, where DL/DL # are connected to an SA internal node 503 in the SA circuit 502 with the example column also including NVM array 506, XNOR circuit 504, and PRE_CHARGE device 508. In the example column of FIG. 5, the DL/DL # are connected to the SA internal node 303 without a pass gate device controlled by the column select (COLSEL) signal. The example memory structure of FIG. 5 can also be used to reduce a complexity of timing control circuit (i.e., reduce COLSEL signal).

Figure 6:
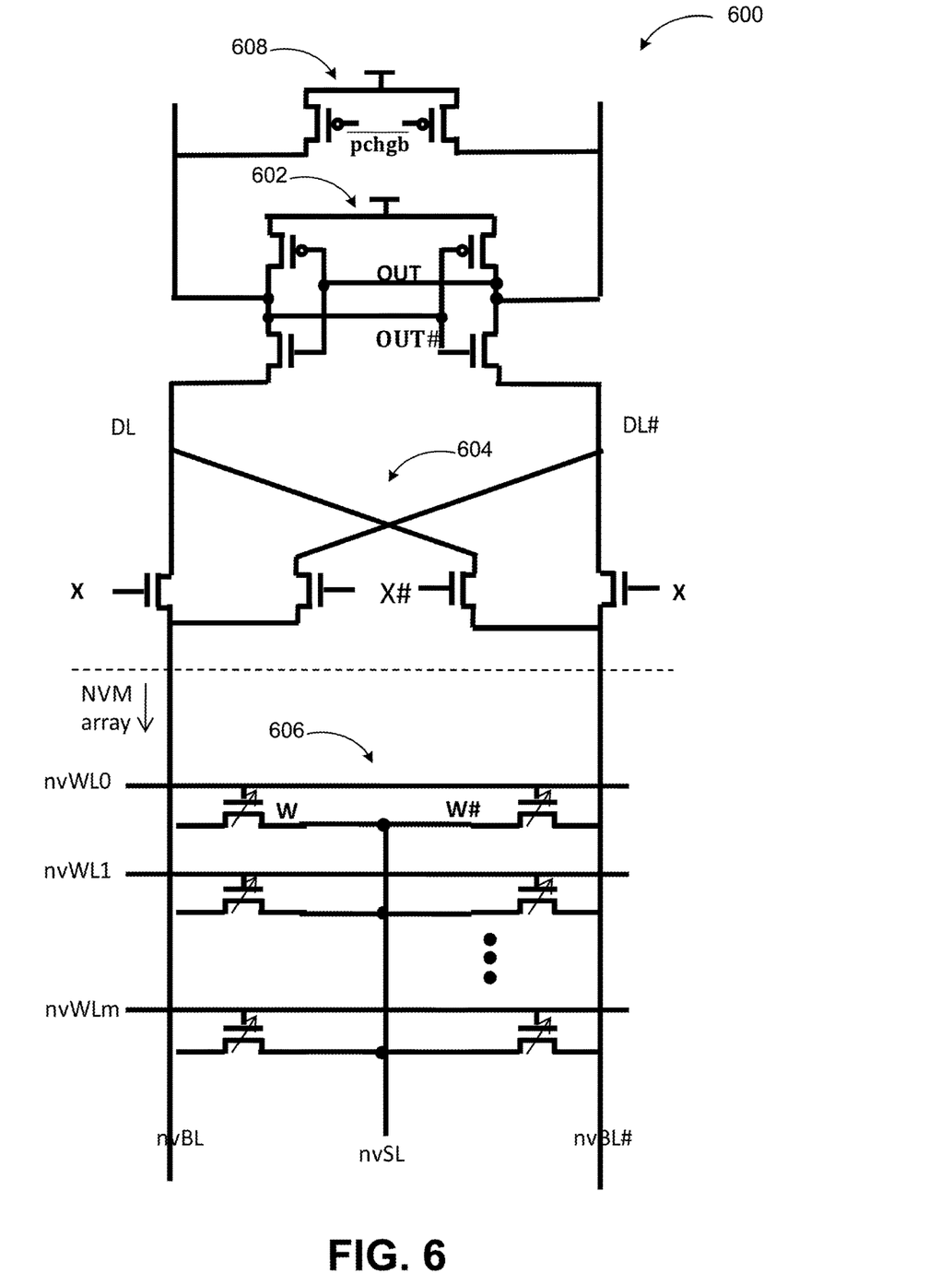
FIG. 6 is a schematic circuit diagram illustrating another variation of an example NVM memory column with an XNOR cell for AI applications.

FIG. 6 is a schematic circuit diagram illustrating another variation of an example NVM memory column with an XNOR cell for AI applications, arranged in accordance with embodiments described herein.

Diagram 600 shows DL/DL # connected to the SA 602 with the example column also including NVM array 606, XNOR circuit 604, and PRE_CHARGE device 608. An example XNOR operation during reading of data from the NVM array 606 may include NVM bit-line nvBL/nvBL # and SA input DL/DL # being initialized at VDD level before the read. Then, the NVM cells may be activated by nvWL. A GND voltage level may be applied to nvSL and the nvBL/nvB L# may be discharged down through the NVM cell. Due to the Vt difference between the differential NVM cells, nvBL/nvBL # may have a difference.

Through the cross-connected NMOS transistors connecting with X/X #, the difference between nvBL/nvBL # may transfer to DL/DL #. When X=1, the DL/DL # may connect with nvBL #/nvBL. When X=0, the DL/DL # may connect with nbBL/nvBL #. When the level of DL or DL # is closed to GND, the OUT of SA may be XNOR(X,W). The advantage of this variation is that the complexity of timing circuit may be reduced substantially. The signals COLSEL and SEN are no longer needed.

Figure 7:
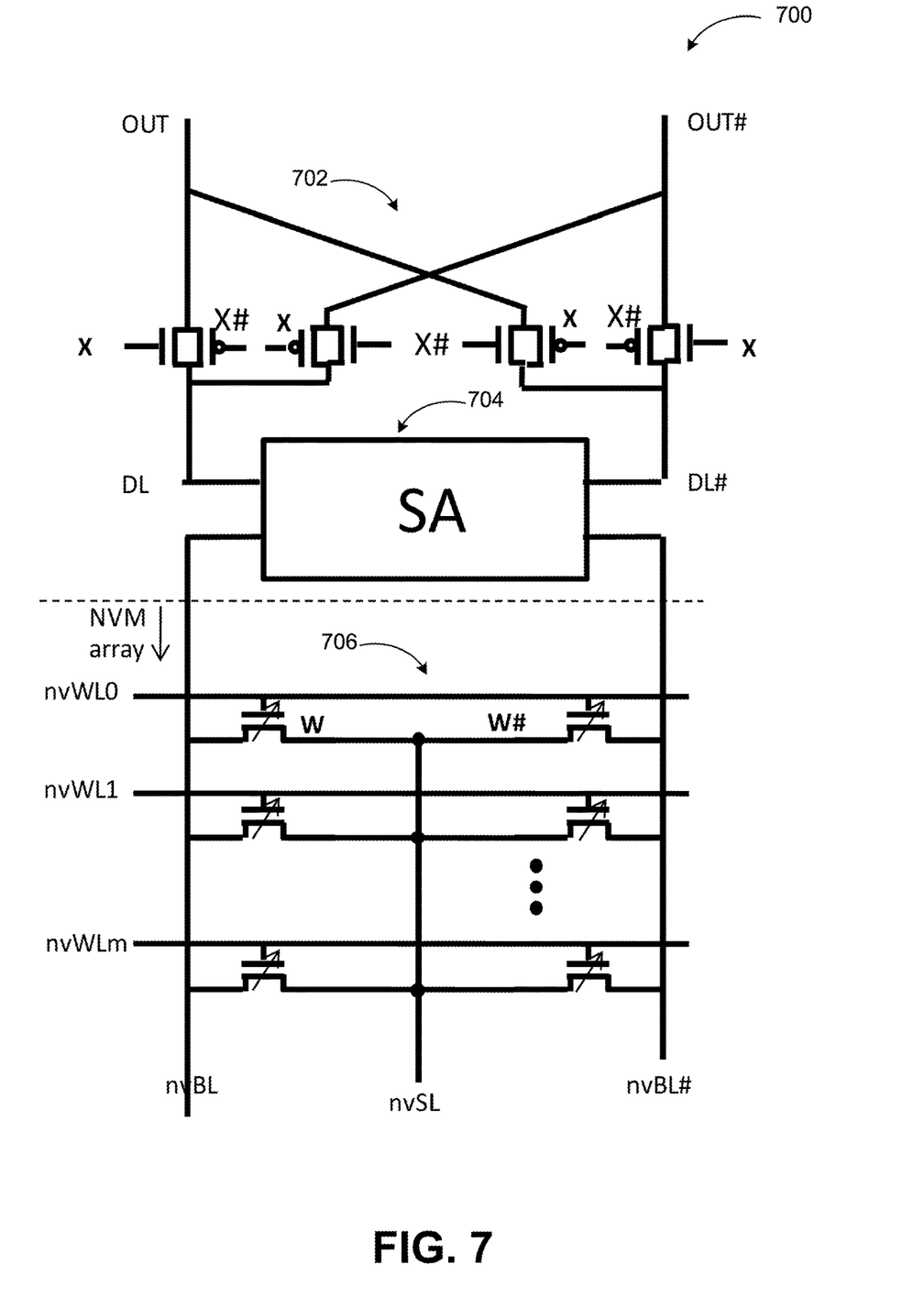
FIG. 7 is a schematic circuit diagram illustrating a further variation of an example NVM memory column with an XNOR+SA cell for AI applications.

FIG. 7 is a schematic circuit diagram illustrating a further variation of an example NVM memory column with an XNOR+SA cell for AI applications, arranged in accordance with embodiments described herein.

Diagram 700 shows SA 704 with DL/DL # connected to the XNOR circuit 702 and the NVM array 706 also connected to the SA 704. An example XNOR operation after reading of data from the NVM array 706 may include NVM bit-line nvBL/nvBL # and SA input DL/DL # being initialized at GND level before the read. Then, the NVM cells may be activated by nvWL. A VDD voltage level may be applied to nvSL and the nvBL/nvBL # may be charged up through the NVM cell. Alternatively, a GND voltage level may be applied to nvSL, and the nvBL/nvBL # may be discharged down through the NVM cell. Due to the Vt difference between the differential NVM cells, nvBL/nvBL # may have a difference. Next, the SA circuit 704 may be enabled. Due to the difference between nvBL and nvBL #, the data may be latched by the SA. Through the transmission gate connecting with X/X #, the OUT is XNOR(X,W). Table 3 shows examples of the various bit values.

TABLE 3

| | OUT = XNOR(X,W) | | | |
|---|---|---|---|---|
| W | nvBL W | DL | X | OUT |
| 0 | 1 | 0 | 0 | 1 |
| 1 | 0 | 1 | 0 | 0 |
| 0 | 1 | 0 | 1 | 0 |
| 1 | 0 | 1 | 1 | 1 |

Figure 8:
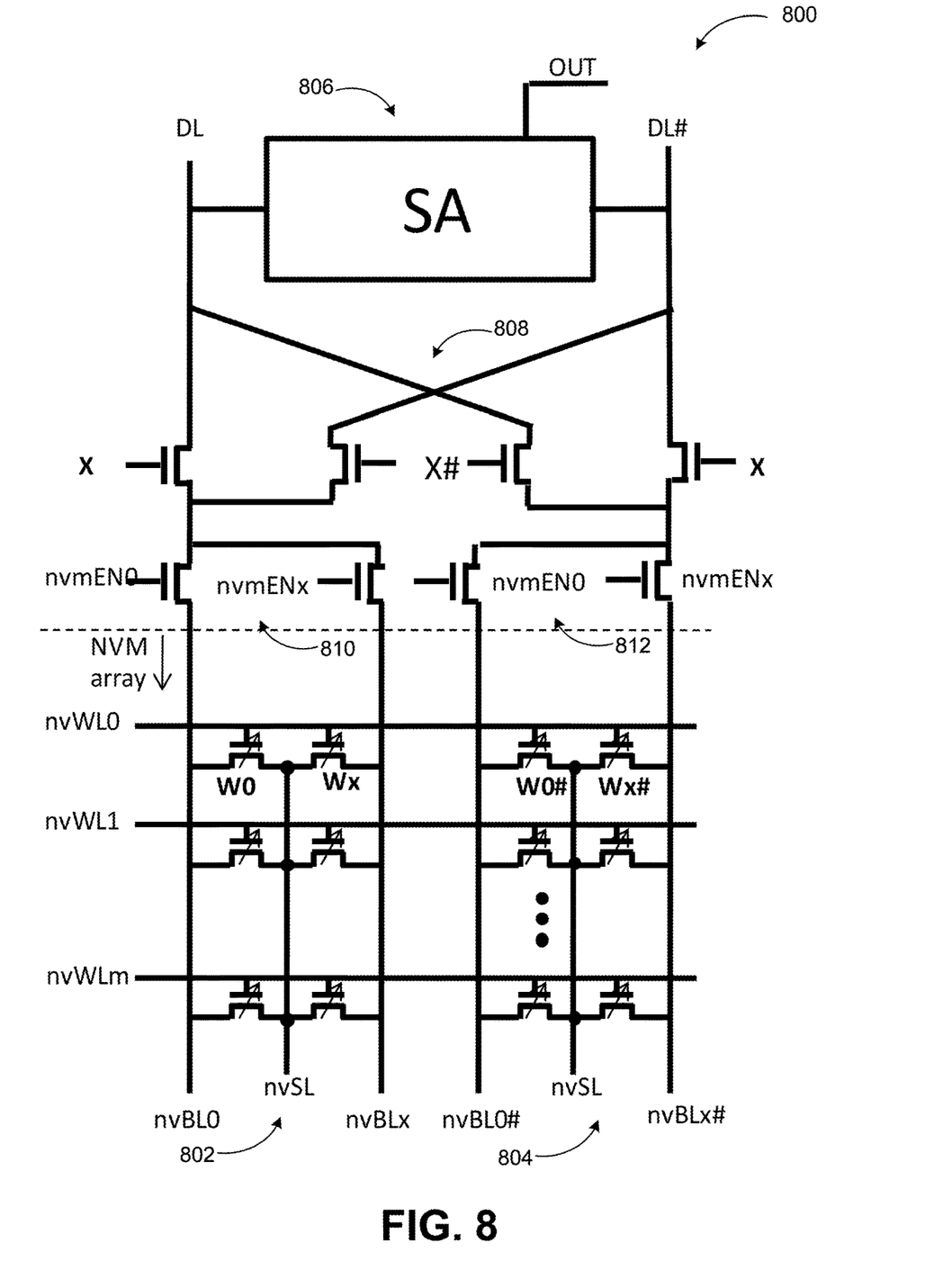
FIG. 8 is a schematic circuit diagram illustrating a version of the example NVM structure where the sense amplifier is connected to multiple NVM columns for AI applications.

FIG. 8 is a schematic circuit diagram illustrating a version of the example NVM structure where the sense amplifier is connected to multiple NVM columns for AI applications, arranged in accordance with embodiments described herein.

As shown diagram 800, SA 806 is connected through the XNOR circuit 808 to at least two NVM arrays 802, 804 with select transistor pairs 810 and 812. In one embodiment, the input of SA 808 DL/DL # can be connected to multiple NVM bit-lines nvBL[x:0], which may be decoded by the select signal nvmEN[x:0]. This structure may have well pitch alignment in layout as the NVM cell pitch may be smaller than the SA cell applying an advanced manufacturing process. For the XNOR operation, nvmEN0 may be enabled, and the differential pair state on nvBL0/nvBL0 # can be loaded to DL/DL #. Next, nvmENx may be enabled, and the differential pair state on nvBLx/nvBLx # can be loaded to DL/D L#. When the SA is enabled, the OUT is XNOR (X,W). The MOS connected with X/X # may be PMOS or NMOS depending on the type of SA structure and mode of reading the array.

Figure 9:
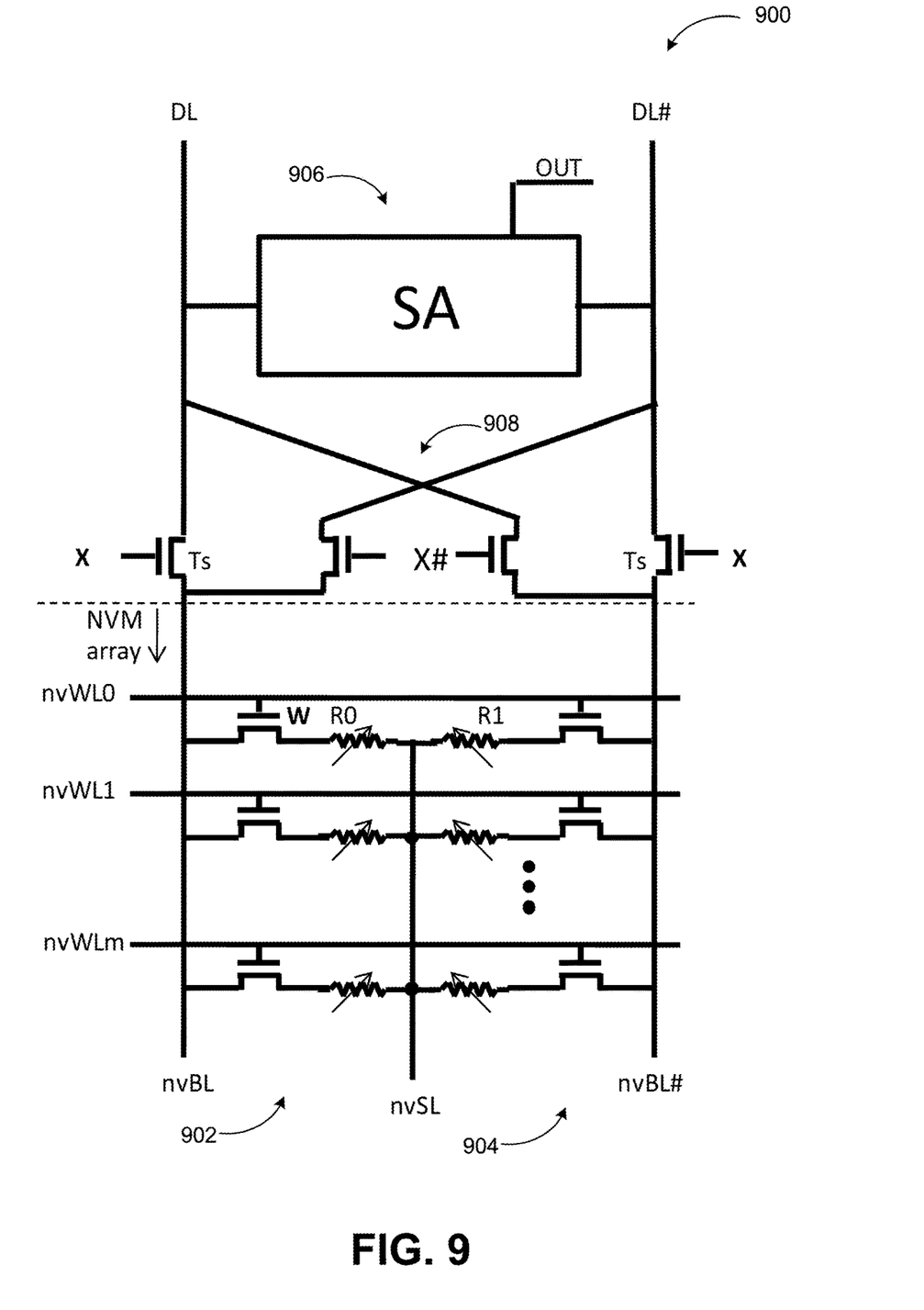
FIG. 9 is a schematic circuit diagram illustrating a version of the example NVM structure with an XNOR+SA circuit where the NVM array is a 1T1R array for AI applications.

FIG. 9 is a schematic circuit diagram illustrating a version of the example NVM structure with an XNOR+SA circuit where the NVM array is a 1T1R array for AI applications, arranged in accordance with embodiments described herein.

The SA 906 and the XNOR circuit 908 are coupled to the differential NVM array, where each side 902, 904 includes a transistor and a resistor. Each 1T1R NVM cell includes a switch device and a programmable resistor. The source-line nvSL may be a common line for the array or may be a separated signal line for each column. The programmable resistors may be programmed to at least two resistance states, a LRS (low resistance state) and a FIRS (high resistance state). In one embodiment, the programmable resistor may be a MRAM device such as a STT MTJ device (a spin transfer torque magnetic tunnel junction resistor). When a voltage (equal to VDD, or higher than VDD in some examples) is applied to nvSL, and nvBL/nvBL # is pulled to ground while nvWL0 is active, both R0 and R1 may be turned to a LRS state.

When a voltage (VDD-Vt, for example) is applied to nvBL and GND level to nvSL, R0 may be turned to the HRS state by turning on nvWL0. R1 may be turned to the HRS state by applying nvBL # to VDD, nvSL to ground and nvWL0 to VDD. Data is transferred from NVM to SA with active SA and NVM WL. A data '1' may induce nvBL to be 0, when R0/R1 at an LRS/HRS state. A data '0' may induce nvBL to be 1, when R0/R1 at a HRS/LRS state. Then, OUT is XNOR(X,W). The programmable resistor element is not limited to MRAM, but also may be a PCRAM, FeRAM, RRAM, and so on. The MOS connected with X/X # may be PMOS or NMOS depending on the type of SA structure and mode of reading array. Table 4 shows examples of the various bit values.

TABLE 4

| | | OUT = XNOR(X,W) | | | |
|---|---|---|---|---|---|
| R0 | W | nvBL | X | DL | OUT |
| HRS | 0 | 1 | 0 | 0 | 1 |
| LRS | 1 | 0 | 0 | 1 | 0 |
| HRS | 0 | 1 | 1 | 1 | 0 |
| LRS | 1 | 0 | 1 | 0 | 1 |

Figure 10:
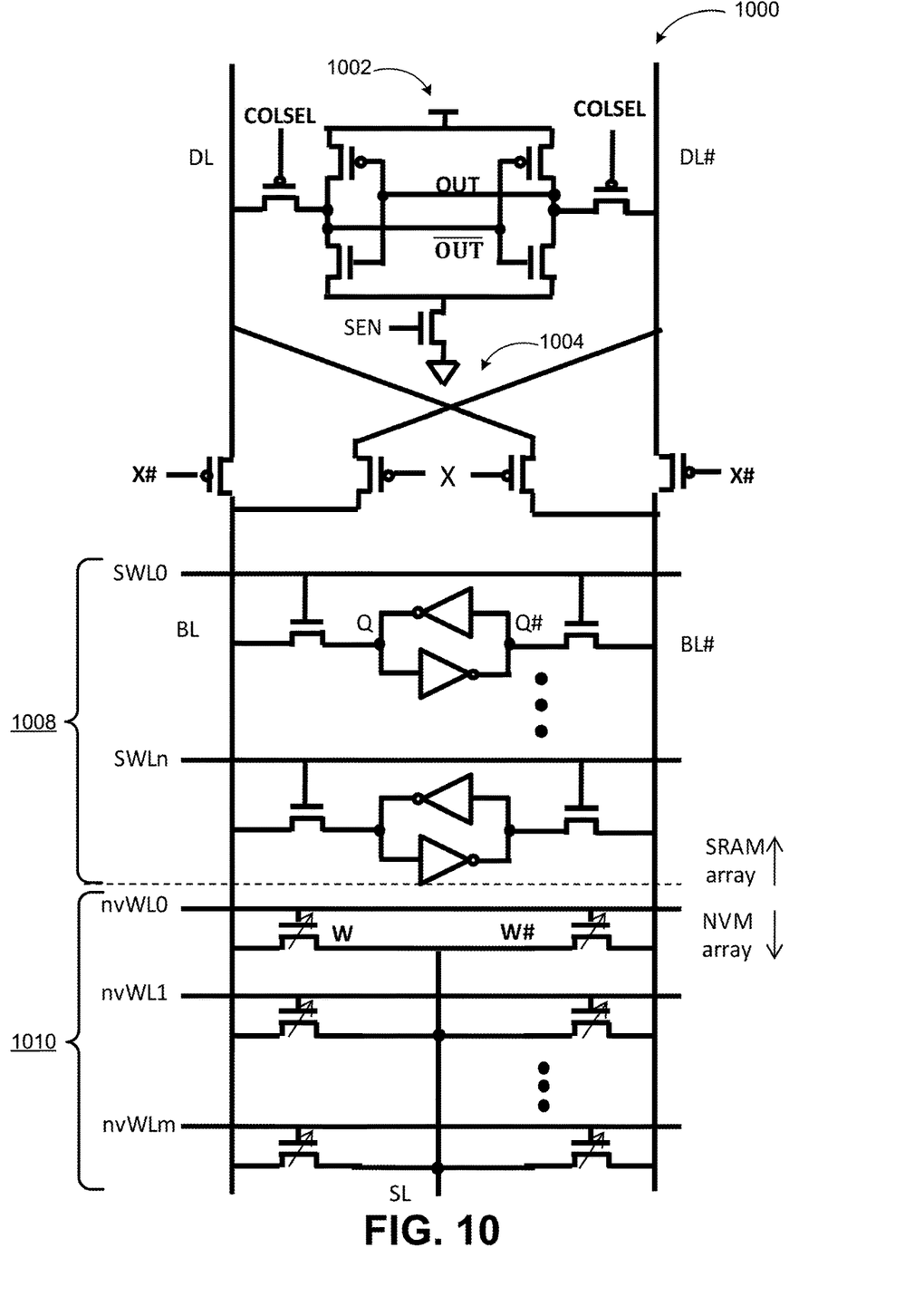
FIG. 10 is a schematic circuit diagram illustrating an example memory structure with an XNOR+SA circuit where the memory array includes an SRAM portion and an NVM portion for AI applications.

FIG. 10 is a schematic circuit diagram illustrating an example memory structure with an XNOR+SA circuit where the memory array includes an SRAM portion and an NVM portion for AI applications, arranged in accordance with embodiments described herein.

Diagram 1000 shows the example structure with XNOR circuit 1004, sense amplifier 1002 and memory array comprising SRAM portion 1008 and NVM portion 1010. Typically, the speed of SRAM is much faster than NVM. In some embodiments, SRAM and NVM portions may be combined in a memory column. Before an XNOR operation, loading the data in the NVM portion to the SRAM portion may be executed once. Then, the XNOR operation may be executed using the data stored in SRAM. The speed of the memory structure may improve due to the SRAM characteristics. For the XNOR operation, data W/W # may be transferred from NVM potion to SRAM portion and stored as Q/Q # in the SRAM. SRAM bit-line BL/BL # and sense amplifier (SA) input DL/DL # may be initialized at VDD level before the read. Then, the SRAM cell may be activated by SWL0.

The BL/BL # may be discharged through the SRAM bitcell. Due to the Q/QB storing the different data, BL/BL # may have a difference. Through PMOS connecting with X/X #, the difference may transfer to DL/DL #. When X=0, the DL/DL # connects with BL #/BL. When X=1, the DL/DL # connects with BL/BL #. And, the difference between DL and DL # may transfer into internal node OUT and OUT #. Finally, the SA enable signal (SEN) is ramped up. Due to the difference between DL and DL #, the data may be latched by the SA. The OUT signal is XNOR(X,W). Table 5 shows examples of the various bit values.

TABLE 5

| | | OUT = XNOR(X,W) | | |
|---|---|---|---|---|
| X | W(Q) | BL | DL | OUT |
| 0 | 0 | 1 | 0 | 1 |
| 0 | 1 | 0 | 1 | 0 |
| 1 | 0 | 1 | 1 | 0 |
| 1 | 1 | 0 | 0 | 1 |

Figure 11:
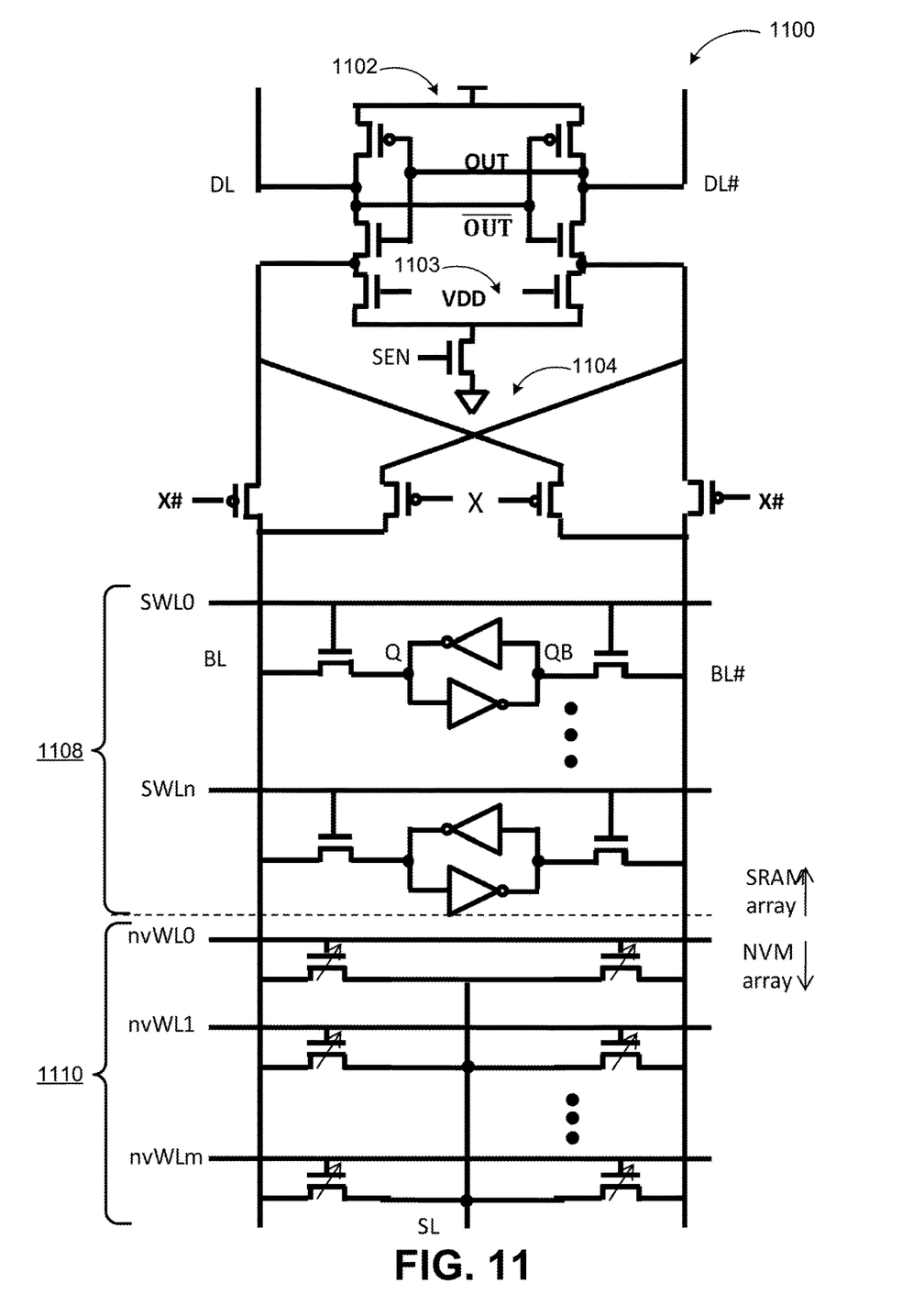
FIG. 11 is a schematic circuit diagram illustrating another version of the example memory structure of FIG. 10 with an XNOR+SA circuit where the memory array includes an SRAM portion and an NVM portion for AI applications.

FIG. 11 is a schematic circuit diagram illustrating another version of the example memory structure of FIG. 10 with an XNOR+SA circuit where the memory array includes an SRAM portion and an NVM portion for AI applications, arranged in accordance with embodiments described herein.

As in FIG. 10, diagram 1100 includes SA circuit 1102 and XNOR circuit 1104 with memory array comprising SRAM portion 1108 and NVM portion 1110. The internal node 1103 of the SA is also shown.

In one embodiment, the DL/DL # may be connected to SA internal node 1103 without pass gate device controlled by COLSEL signal. This structure can reduce the complexity of timing control circuit (reduce signal COLSEL signal).

Some embodiments are directed to example processes to operate an NVM memory structure with an XNOR cell and sense amplifier for AI applications. The operations of any process described herein are not necessarily presented in any particular order and that performance of some or all of the operations in an alternative order(s) is possible and is contemplated. The operations have been presented in the demonstrated order for ease of description and illustration. Operations may be added, combined, modified, omitted, and/or performed simultaneously, in a different order, etc., without departing from the scope of the present disclosure.

The illustrated process can be ended at any time and need not be performed in its entirety. Some or all operations of the processes, and/or substantially equivalent operations, can be performed by execution by one or more processors of computer-readable instructions included on a computer storage media, such as described herein, including a tangible non-transitory computer-readable storage medium. The term "computer-readable instructions," and variants thereof, as used in the description and claims, is used expansively herein to include routines, applications, application modules, program modules, programs, components, data structures, algorithms, or the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, or the like.

Figure 12:
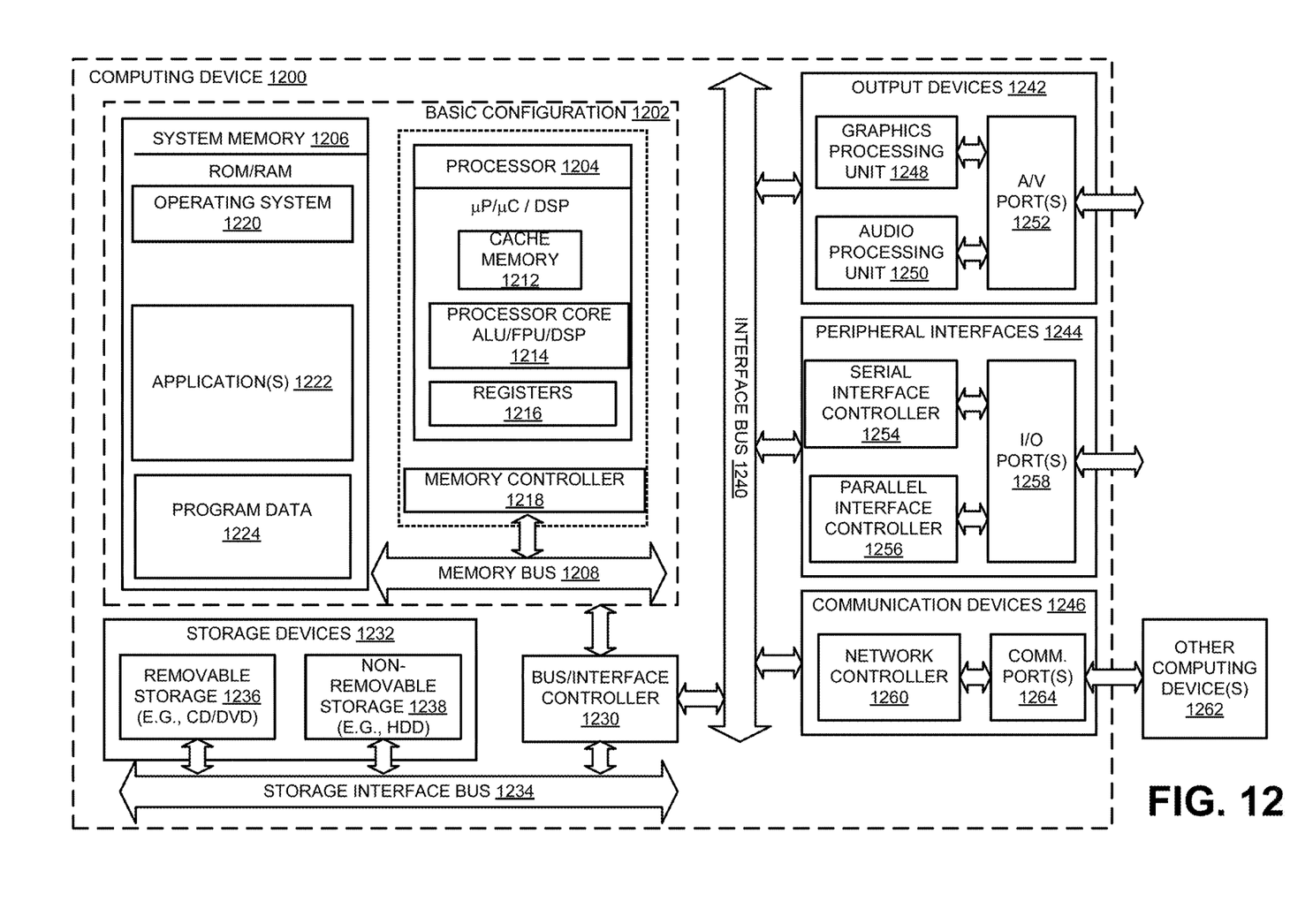
FIG. 12 is a block diagram illustrating an example computing device that is arranged for implementing the memory structures discussed herein.

FIG. 12 is a block diagram illustrating an example computing device 1200 that is arranged to incorporate or operate NVM memory structures with an XNOR cell and sense amplifier for AI applications, in accordance with at least some embodiments described herein. In a very basic configuration 1202, computing device 1200 typically includes one or more processors 1204 and system memory 1206. A memory bus 1208 can be used for communicating between the processor 1204 and the system memory 1206.

Depending on the desired configuration, processor 1204 can be of any type including but not limited to a microprocessor (μP), a microcontroller (μC), a digital signal processor (DSP), or any combination thereof. Processor 1204 can include one more levels of caching, such as cache memory 1212, a processor core 1214, and registers 1216. The processor core 1214 can include an arithmetic logic unit (ALU), a floating point unit (FPU), a digital signal processing core (DSP core), or any combination thereof. A memory controller 1218 can also be used with the processor 1204, or in some implementations the memory controller 1212 can be an internal part of the processor 1204.

Depending on the desired configuration, the system memory 1206 can be of any type including but not limited to volatile memory (such as RAM), non-volatile memory (such as ROM, flash memory, etc.) or any combination thereof. System memory 1206 typically includes an operating system 1220, one or more applications 1222, and program data 1224.

Computing device 1200 can have additional features or functionality, and additional interfaces to facilitate communications between the basic configuration 1202 and any required devices and interfaces. For example, a bus/interface controller 1240 can be used to facilitate communications between the basic configuration 1202 and one or more data storage devices 1232 via a storage interface bus 1234. The data storage devices 1232 can be removable storage devices 1236, non-removable storage devices 1238, or a combination thereof. Examples of removable storage and non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media can include volatile and nonvolatile, removable and non-removable media implemented in any method or technology for storage of information, such as computer readable instructions, data structures, program modules, or other data.

System memory 1206, removable storage 1236 and non-removable storage 1238 are all examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which can be used to store the desired information and which can be accessed by computing device 1200. Any such computer storage media can be part of device 1200. Thus, any of the computer storage media may be implemented using the NVM memory structures with an XNOR cell and sense amplifier for AI applications as discussed herein.

Computing device 1200 can also include an interface bus 1240 for facilitating communication from various interface devices (e.g., output interfaces, peripheral interfaces, and communication interfaces) to the basic configuration 1202 via the bus/interface controller 1230. Example output devices 1242 include a graphics processing unit 1248 and an audio processing unit 1250, which can be configured to communicate to various external devices such as a display or speakers via one or more A/V ports 1252. Example peripheral interfaces 1244 include a serial interface controller 1254 or a parallel interface controller 1256, which can be configured to communicate with external devices such as input devices (e.g., keyboard, mouse, pen, voice input device, touch input device, etc.) or other peripheral devices (e.g., printer, scanner, etc.) via one or more I/O ports 1258. An example communication device 1246 includes a network controller 1260, which can be arranged to facilitate communications with one or more other computing devices 1262 over a network communication via one or more communication ports 1264. The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, communication media can include wired media such as a wired network or direct-wired connection, and wireless media such as acoustic, radio frequency (RF), infrared (IR) and other wireless media. The term computer readable media as used herein can include both storage media and communication media.

Computing device 1200 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 1200 can also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, compounds, or compositions, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations.

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include, but not be limited to, systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

Further, the use of the terms "first," "second," "third," "fourth," and the like is to distinguish between repeated instances of a component or a step in a process and does not impose a serial or temporal limitations unless specifically stated to require such serial or temporal order.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," or the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A memory device for artificial intelligence (AI) applications, the memory device comprising:
   a plurality of columns, wherein each column comprises:
      a non-volatile memory (NVM) array arranged as a column of NVM cells; and
      a sense amplifier (SA) and XNOR cell, wherein the NVM array is coupled to the SA and XNOR cell through the NVM array's bitlines (BL, BL #) and each of the plurality of columns is configured to perform an XNOR operation during a read operation from a corresponding NVM array, the XNOR operation comprising:
      initialization of the NVM bitlines and SA input lines at ground (GND) level;
      activation of the NVM cell through a corresponding wordline (WL);
      application of supply voltage (VDD) to a common source line (SL) of the NVM cell such that the bitlines are charged through the NVM cell; and
      ramping up an SA enable signal (SEN) such that the SA latches data from the NVM cell.

2. The memory device of claim 1, wherein at least a portion of control gates of the NVM cells are coupled to a same NVM word line (nvWL), and wherein one or more sources and one or more drains of at least some of the NVM cells are coupled to the bitlines (BL, BL #).

3. The memory device of claim 1, wherein the NVM cells are arranged in a differential transistor pair or a single cell configuration.

4. The memory device of claim 1, wherein one or more sources of the NVM cells are coupled to the common source line (SL) for the NVM array.

5. The memory device of claim 1, wherein at least one of the NVM cells includes a SONOS split gate cell, a floating gate cell, an eFlash cell, a pFlash cell, a 1T1R resistive RAM, a resistive memory based cell, a phase change memory based cell, a ferroelectric RAM based cell, or a magnetic RAM based cell.

6. The memory device of claim 1, wherein the NVM cells are 1T1R resistive RAM cells, and each NVM cells comprises a transistor acting as a switch device and a programmable resistor.

7. The memory device of claim 6, wherein the programmable resistor is programmable between a low resistance state (LRS) and a high resistance state (HRS).

8. The memory device of claim 6, wherein the programmable resistor is an MRAM, a PCRAM, an FeRAM, or an RRAM.

9. The memory device of claim 1, wherein data lines (DL, DL #) from the NVM array are coupled to an internal node of the SA without a pass gate device controlled by a column select (COLSEL) signal.

10. The memory device of claim 1, wherein inputs of the SA are coupled to multiple data lines (DL, DL #) from a plurality of NVM arrays and, the NVM arrays are selected during a read operation through a pair of selection transistors for each NVM array.

11. A memory device for artificial intelligence (AI) applications, the memory device comprising:
    a plurality of columns, wherein each column comprises:
       a non-volatile memory (NVM) array arranged as a column of NVM cells; and
       a sense amplifier (SA) and XNOR cell, wherein the NVM array is coupled to the SA and XNOR cell through the NVM array's bitlines (BL, BL #) and each of the plurality of columns is configured to perform an XNOR operation during a read operation from a corresponding NVM array, the XNOR operation comprising:
       initialization of the NVM bitlines and SA input lines at supply voltage (VDD) level;
       activation of the NVM cell through a corresponding wordline (WL);
       application of ground (GND) level to a common source line (SL) of the NVM cell such that the bitlines are discharged through the NVM cell; and
       ramping up an SA enable signal (SEN) such that the SA latches data from the NVM cell.

12. The memory device of claim 11, wherein at least a portion of control gates of the NVM cells are coupled to a same NVM word line (nvWL), and wherein one or more sources and one or more drains of at least some of the NVM cells are coupled to the bitlines (BL, BL #).

13. The memory device of claim 11, wherein the NVM cells are arranged in a differential transistor pair or a single cell configuration.

14. The memory device of claim 11, wherein one or more sources of the NVM cells are coupled to the common source line (SL) of the NVM array.

15. A memory device for artificial intelligence (AI) applications, the memory device comprising:
    a plurality of columns, wherein each column comprises:
       a non-volatile memory (NVM) array arranged as a column of NVM cells; and
       a sense amplifier (SA) and XNOR cell, wherein the NVM array is coupled to the SA and XNOR cell through the NVM array's bitlines (BL, BL #) and each of the plurality of columns is configured to perform an XNOR operation following a read operation from a corresponding NVM array, the XNOR operation comprising:
    initialization of the NVM bitlines and SA input lines at ground (GND) level;
    activation of the NVM cell through a corresponding wordline (WL);
    application of supply voltage (VDD) level to a common source line (SL) of the NVM cell such that the bitlines are charged through the NVM cell or application of ground (GND) level to the SL of the NVM cell such that the bitlines are discharged through the NVM cell;
    enabling the SA such that the SA latches data from the NVM cell; and
    reading an output signal through a transmission gate connected to XNOR cell.

16. The memory device of claim 15, wherein at least a portion of control gates of the NVM cells are coupled to a same NVM word line (nvWL), and wherein one or more sources and one or more drains of at least some of the NVM cells are coupled to the bitlines (BL, BL #).

17. The memory device of claim 15, wherein the NVM cells are arranged in a differential transistor pair or a single cell configuration.

18. The memory device of claim 15, wherein one or more sources of the NVM cells are coupled to the common source line (SL) of the NVM array.

* * * * *